United States Patent [19]
Giordano et al.

[11] Patent Number: 5,807,455
[45] Date of Patent: Sep. 15, 1998

[54] SYSTEM AND METHOD FOR UNIFORM PRODUCT COMPRESSIBILITY IN A HIGH THROUGHPUT UNIAXIAL LAMINATION PRESS

[75] Inventors: Michael J. Giordano, Wappingers Falls; Govindarajan Natarajan, Pleasant Valley; Edward J. Pega, Hopewell Junction; Joseph G. Zhou, Brooklyn, all of N.Y.

[73] Assignee: International Business Machines Corporation, Armonk, N.Y.

[21] Appl. No.: 686,238

[22] Filed: Jul. 23, 1996

[51] Int. Cl.⁶ .................................................. B32B 31/00
[52] U.S. Cl. .......................... 156/228; 156/64; 156/288; 156/358; 156/583.1; 100/50; 100/195; 100/208; 100/291
[58] Field of Search ............................. 156/64, 228, 358, 156/580, 583.1, 288; 100/50, 193, 194, 195, 208, 291; 425/149, 150

[56] References Cited

U.S. PATENT DOCUMENTS

| | | | |
|---|---|---|---|
| 3,370,526 | 2/1968 | Parker | 100/208 X |
| 3,743,469 | 7/1973 | Gibbons | 425/450 |
| 3,824,058 | 7/1974 | Axer et al. | 425/338 |
| 3,933,070 | 1/1976 | Walters et al. | 100/291 X |
| 4,199,539 | 4/1980 | Von Herrmann et al. | 425/149 X |
| 4,462,291 | 7/1984 | Schulz | 100/291 X |
| 4,535,689 | 8/1985 | Putkowski | 100/214 |
| 5,048,178 | 9/1991 | Bindra et al. | 29/830 |
| 5,163,363 | 11/1992 | Gilgert et al. | 100/35 |
| 5,370,760 | 12/1994 | Mori et al. | 156/89 |

*Primary Examiner*—James Sells
*Attorney, Agent, or Firm*—DeLio & Peterson,LLC; Peter W. Peterson; Aziz M. Ahsan

[57] ABSTRACT

The apparatus of the present invention enables the lamination of a plurality of planar and non-planar objects in a lamination apparatus where multiple frames per platen and multiple platens per cycle are used. With the preferred embodiment, lamination of multiple products of various thicknesses is achieved, while simultaneously maintaining the pressure uniformity across all stacks. The result is achieved by using a height equalizing lamination punch head, control logic and verification devices.

23 Claims, 8 Drawing Sheets

SYSTEM AND METHOD FOR UNIFORM PRODUCT COMPRESSIBILITY IN A HIGH THROUGHPUT UNIAXIAL LAMINATION PRESS

BACKGROUND OF THE INVENTION

1. Field of the Invention

The present invention relates generally to an apparatus and method for forming laminated structures and more particularly to an apparatus and method for fabricating a plurality of multilayer ceramic products simultaneously with uniform uniaxial compression.

2. Problem to be Solved

Multilayer ceramic (MLC) structures are used in the production of electronic substrates and devices. The MLCs can have various layering configurations. For example, a MLC circuit substrate may comprise patterned metal layers which act as electrical conductors sandwiched in between ceramic layers which act as a dielectric medium. The ceramic layers have tiny holes or VIA holes. Prior to lamination, the VIA holes are filled with conductive metal paste and sintered to form VIAS which provide the electrical connection between the layers. In addition, the substrates may have termination pads for attaching semiconductor chips, connector leads, capacitors, resistors, etc.

Generally, conventional ceramic structures are formed from ceramic green sheets which are prepared from a slurry of ceramic particulates, thermoplastic polymer binders, plasticizers, and solvents. This composition is spread or cast into ceramic sheets or slips from which the solvents are subsequently volatilized to provide coherent and self-supporting flexible green sheets. After punching, stacking and laminating, the green sheets are fired at temperatures sufficient to burn-off or remove the unwanted polymeric binder resin and sinter the ceramic particulates together into a densified ceramic substrate. The present invention is directed to the lamination steps of this process.

In the MLC packaging industry it is very common to use uniaxial hydraulic lamination presses to provide pressure necessary for laminating the personalized or punched, stacked green sheets in order to obtain layer to layer connectivity. Designing appropriate lamination cycles or algorithms, which include controlling pressure, temperature and lamination time for a given green sheet and metal paste combination, is necessary for obtaining predictable product quality.

Generally, lamination methods include the control of variables such as pressure, temperature and time. These controls ensure layer to layer bonding with minimal pattern distortion, uniformity in product thickness and material compression. Lamination pressure and temperature is used to adjust the product's shrinkage along the x–y axis during sintering, irrespective of the product's x–y–z dimensions.

In particular, the lamination pressure plays an important role in shrinkage control. The lamination temperature depends on the glass transition temperature $T_g$ of the binder system which adds strength for pre-fire handling. These temperatures vary and are typically between 1250° C. and 1560° C. depending upon the raw material used to form the green sheets. Some green sheet raw materials include alumina, glass ceramics, aluminum nitride, borosilicates, etc.

Green sheet technology has advanced so that the mechanical properties of the sheets can be reproduced consistently; however, the green sheet thickness and green sheet density can only be controlled within certain accuracy and tolerance. For example, the thickness variation in a 0.02043 cm (0.008 in.) green sheet could be +/− 0.00127 cm (0.0005 in.) and the green sheet density can vary from 1.52 g/cm$^3$ (0.05491 lb/in$^3$) to 1.65 g/cm$^3$ (0.05961 lb/in$^3$) on a nominal green sheet density of 1.55 g/cm$^3$ (0.05600 lb/in$^3$).

In an alumina system, it is preferred that approximately 11% nominal compression be created in the Z axis during lamination. The x–y axis shrinkage and camber are kept under acceptable spread in sintering by controlling the laminate compression. This is achieved consistently in uniaxial laminations as long as the green sheet density is within acceptable range as described above. The variation in sheet thickness produces various thicknesses of MCM packages, i.e. thicker or thinner, at a constant lamination pressure. The lamination pressure is chosen depending upon the final x–y substrate size and end laminate density. A typical lamination pressure is 27,580 kPa (4,000 psi). The green laminate, or unfired stack of green sheets, density is assured as long as the lamination pressure is the same. This starting laminate density essentially controls the x–y axis shrinkage in sintering for a given sinter cycle.

The apparatus and process of single frame lamination on a platen is simple and well understood and therefore, the lamination process can be easily controlled. However, single frame lamination technology is time consuming. The cost of lamination can be substantially reduced by improving the throughput of the press or tooling. Throughput can be improved if multiple frames per tool were used in a single lamination cycle.

FIG. 1 illustrates the prior art lamination apparatus which uses a single frame per platen per lamination cycle and a hydraulic lamination press (not shown). The lamination frame 22 and green sheet stack 24 containing at least one green sheet 25 are placed on a first platen 26a of a hydraulic press. The first platen 26a moves upward such that the lamination punch 30 comes in contact with a lamination plate 28b on the stack 24. The lamination punch 30 is secured to a second platen 26b. The hydraulic press applies the required pressure, shown by arrow 34 to the first platen 26a which is transferred to the green sheet stack 24. Typically, the platens 26a,b are heated to a temperature above the glass transition temperature $T_g$ of the polymer in the green sheet formulation; however, a cold lamination process may also be used. The temperature and pressure are controlled for a predetermined time ensuring the bonding of the green sheets and the required laminate compressibility.

While the lamination of multiple products can be achieved in a single frame, physical limitations exist due to thickness of the product, required temperature uniformity, etc.

U.S. Pat. No. 5,163,363 addresses a device to distribute pressure equally to stacks during sintering and to prevent product warpage during densification. A very low force, on the order of 55.16 to 68.95 kPa (8 to 10 psi), is applied during this process. The device is suitable for sintering; however, it is not suitable for lamination because it can not work at the high pressure on the order of 6,895 to 48,265 kPa (1,000 to 7,000 psi), which is necessary for lamination.

The prior art lamination process could take several minutes and handles only single frame lamination on a platen. The procedure is slow and therefore, it is necessary to enhance the productivity of the lamination process to reduce the manufacturing cost by increasing the number of frames per platen during each lamination process and also provide a way to laminate substrates of various thicknesses.

Bearing in mind the problems and deficiencies of the prior art it is therefore an object of the present invention to provide a novel method and apparatus for laminating plurality of products of various thicknesses in a single lamination cycle.

It is another object of the present invention to provide an apparatus and a method that will ensure uniform pressure across plurality of stacked products.

A further object of the present invention is to provide an apparatus and method that will ensure uniform pressure across plurality of stacked green sheets used to produce multilayer ceramic laminates.

It is yet another object of the present invention to have an apparatus and a method for laminating a plurality of stacked green sheets used to produce multilayer ceramic substrates that is very economical.

It is yet another object of the present invention to provide an apparatus and a method for laminating a plurality of stacked green sheets used to produce multilayer ceramic substrates that is predictable and repeatable.

It is yet another object of the present invention to laminate several stacked green sheets products simultaneously with a single lamination cycle.

Still other objects and advantages of the invention will in part be obvious and will in part be apparent from the specification.

SUMMARY OF THE INVENTION

The apparatus of the present invention enables the lamination of a plurality of planar and non-planar objects in a lamination apparatus where multiple frames per platen and multiple platens per cycle are used. With the preferred embodiment, lamination of multiple products of various thicknesses is achieved, while simultaneously maintaining the pressure uniformity across all stacks. The result is achieved by using a height equalizing lamination punch head, control logic and verification devices.

In a first aspect, the present invention relates to a lamination apparatus for laminating a stack of substrate layers comprises a platen, a punch and a press. The platen is adapted to receive a stack of the substrate layers thereon. The punch comprises a first portion and a second portion coupled to the first portion. The punch is aligned and adapted to apply pressure to the stack. The first and second portions are movable relative to one another, in a direction towards and away from the stack, and are adapted for adjusting space to a desired distance between the first and second portions. The press moves the platen and the punch in a direction towards one another for lamination of the stack.

Another aspect of the present invention relates to a lamination apparatus for laminating a plurality of stacks of substrate layers. The apparatus comprises first and second platens, first and second lamination punches and a press.

The first platen has first and second sides and is adapted to receive a first stack of the substrate layers on the first side. The second platen adapted to receive a second stack of the substrate layers on a side adjacent to the first platen. The first lamination punch is positioned adjacent to the first platen and is aligned and adapted to apply pressure to the first stack. The second lamination punch is secured to the second side of the first platen and is adjacent to the second platen. The second punch is aligned and adapted to apply pressure to the second stack. The press moves the second platen and the first punch in a direction towards one another for lamination of the stacks.

In another aspect the present invention relates to a lamination apparatus for laminating a plurality of stacks of substrate layers. The apparatus comprises first and second platens, first and second lamination punches and a press.

The first platen has first and second sides and is adapted to receive a first stack of the substrate layers on the first side. The second platen is adapted to receive a second stack of the substrate layers on a side adjacent to the first platen. The first lamination punch is positioned adjacent to the first platen is aligned and adapted to apply pressure to the first stack. The second lamination punch is secured to the second side of the first platen and adjacent to the second platen. The second punch is aligned and adapted to apply pressure to the second stack. The punch comprises a first portion and a second portion coupled to the first portion. The punch is aligned and adapted to apply pressure to the stack, the first and second portions are movable relative to one another, in a direction towards and away from the stack, and is adapted for adjusting space to a desired distance between the first and second portions. The press moves the second platen and the first punch in a direction towards one another for lamination of the stacks.

In another aspect the present invention relates to a lamination method for laminating a stack of substrate layers. The method comprises the steps of providing a platen, providing a lamination punch and providing a press. The platen is adapted to receive a stack of the substrate layers thereon. The punch comprises a first portion and a second portion coupled to the first portion. The punch is aligned and adapted to apply pressure to the stack. The first and second portions are movable relative to one another, in a direction towards and away from the stack, and are adapted for adjusting space to a desired distance between the first and second portions. The press moves the platen and the punch in a direction towards one another for lamination of the stack. The steps further comprise moving the press to effect contact of the stack with the punch and applying pressure to the stack via the press.

In another aspect the present invention relates to a lamination method for laminating a plurality of stacks of substrate layers. The method comprises the steps of providing a first and a second platen, providing a first and second lamination punch and providing a press. The first platen has first and second sides and is adapted to receive a first stack of the substrate layers on the first side. The second platen adapted to receive a second stack of the substrate layers on a side adjacent to the first platen. The first lamination punch is positioned adjacent to the first platen and is aligned and adapted to apply pressure to the first stack. The second lamination punch is secured to the second side of the first platen and is adjacent to the second platen. The second punch is aligned and adapted to apply pressure to the second stack. The press moves the second platen and the first punch in a direction towards one another for lamination of the stacks. The steps further comprise moving the press to effect contact of the second stack with the second lamination punch, and to effect movement of the first stack to contact the first lamination punch, and applying pressure to the stack via the press.

In another aspect the present invention relates to a lamination method for laminating a stack of substrate layers. The method comprises the steps of providing a first and second platen, providing a first and second lamination punch and providing a press. The first platen has first and second sides and adapted to receive a first stack of the substrate layers on the first side. The second platen is adapted to receive a second stack of the substrate layers on a side adjacent to the first platen. The first lamination punch is positioned adjacent to the first platen and is aligned and adapted to apply pressure to the first stack. The second lamination punch is secured to the second side of the first platen and is adjacent to the second platen. The second punch is aligned and adapted to apply pressure to the second stack. The punches comprise a first portion and a second portion coupled to the first portion. The punch is aligned and adapted to apply pressure to the stack. The first and second portions are movable relative to one another in a direction towards and away from the stack and are adapted for adjusting space to a desired distance between the first and second portions. The press moves the platen and the punch in a direction towards one another for lamination of the stacks. The steps further comprise moving the press to effect contact of the second stack with the second lamination punch and to effect movement of the first stack to contact the first lamination punch and applying pressure to the stack via the press.

In yet another aspect the present invention relates to a lamination method for laminating a stack of substrate layers. The method comprises the steps of providing a platen, providing a lamination punch and providing a press. The platen is adapted to receive a stack of the substrate layers thereon. The punch comprises a first portion and a second portion coupled to the first portion. The punch is aligned and adapted to apply pressure to the stack. The first and second portions are movable relative to one another in a direction towards and away from the stack and are adapted for adjusting space to a desired distance between the first and second portions. The press moves the platen and the punch in a direction towards one another for lamination of the stack. The steps further comprise moving the punch second portion toward the platen to effect contact with the stack, securing the punch first portion to the punch second portion rigidly and applying pressure to the stack via the press.

In yet another aspect the present invention relates to a lamination method for laminating stacks of substrate layers comprises the steps of providing a platen, providing a first and second lamination punch and providing a press. The platen is adapted to receive first and second stacks of the substrate layers thereon. The first punch comprises a first portion and a second portion coupled to the first portion. The first punch aligned and adapted to apply pressure to the first stack. The second punch comprises a first portion and a second portion coupled to the first portion. The second punch is aligned and adapted to apply pressure to the second stack. The first punch first and second portions are movable relative to one another in a direction towards and away from the stacks and is adapted for adjusting space to a desired distance between the first and second portions. The second punch first and second portions are movable relative to one another in a direction towards and away from the stacks and are adapted for adjusting space to a desired distance between the first and second portions. The press moves the platen and the first and second punches in a direction towards one another for lamination of the stack. The steps further comprise moving the first punch second portion toward the platen to effect contact with the first stack, moving the second punch second portion toward the platen to effect contact with the second stack, securing the first punch first portion to the first punch second portion rigidly, securing the second punch first portion to the second punch second portion rigidly and applying pressure to the stacks simultaneously via the press.

BRIEF DESCRIPTION OF THE DRAWINGS

The features of the invention are believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 2:
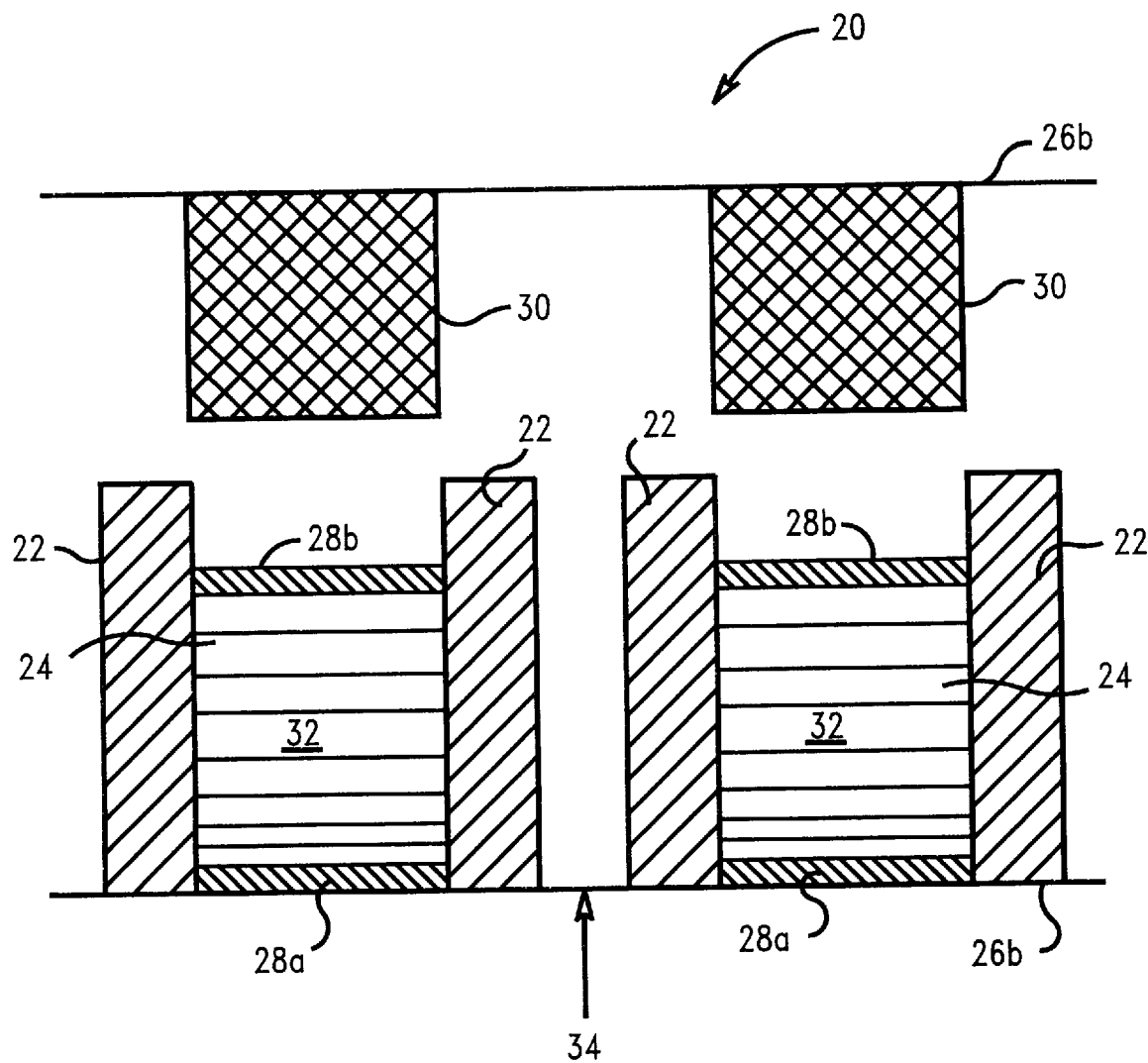
FIG. 2 illustrates a side elevational view a multiple lamination frame apparatus of the present invention for laminating a plurality of multilayer ceramics.

FIG. 2 illustrates a lamination apparatus 20 for laminating multiple stacks in a single cycle. A stack of green sheets 24, containing at least one green sheet 32 is placed inside a lamination frame 22. The stack is placed between lamination plates 28a,b. The arrangement is placed on a first platen 26a of a hydraulic press (not shown). The lamination punch is secured to the second platen 26b. The first platen 26a is moved with drive pressure towards a second platen 26b such that the lamination punch 30 contacts the lamination plate 28b. Drive pressure is much lower than lamination pressure and facilitates moving of the hydraulic press. Lamination pressure, shown by arrow 34, is applied with the hydraulic press to the first platen 26a and is transferred to the green sheet stack 24 for lamination. Typically, for each embodiment of the present invention, the platens 26a,b are heated to a temperature above the glass transition temperature $T_g$ of the polymer in the green sheet formulation; however, a cold lamination process may also be used. The temperature and pressure are controlled for a predetermined time ensuring the bonding of the green sheets and the required laminate compressibility. Pressure and temperature may be determined by one of ordinary skill in the art without undue experimentation.

Figure 1:
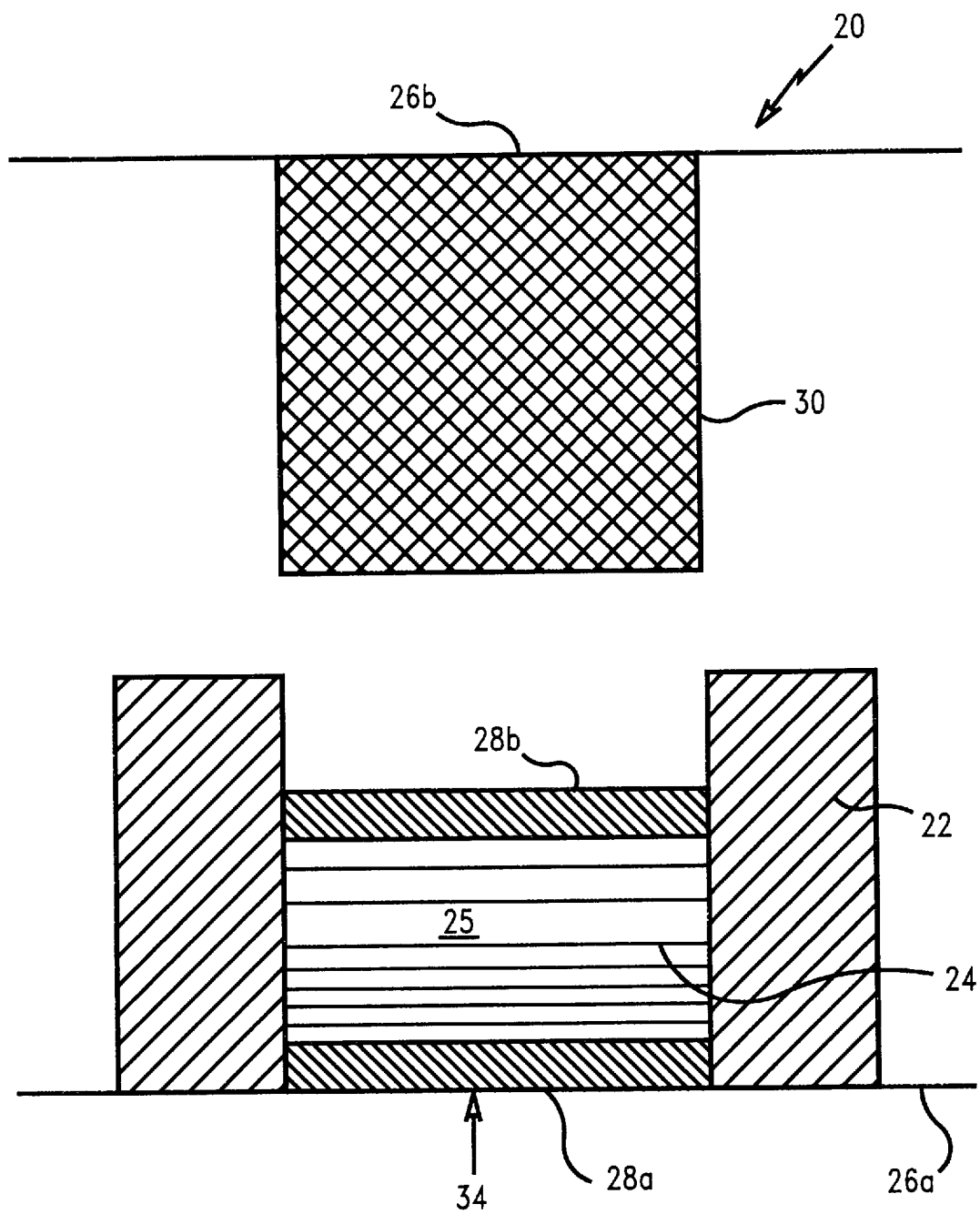
FIG. 1 illustrates the prior art single lamination frame apparatus for laminating stacked multilayer ceramic green sheets.

A plurality of green sheet stacks 24 in a plurality of lamination frames 22 may be laminated simultaneously in between the single set of platens 26a,b. While two lamination frames 22 are shown in FIG. 2, a plurality of additional lamination frame sets may be added. The number of lamination frames 22 and green sheet stacks 24 which can be used in a lamination cycle is limited by the size of the platens 26a,b which typically range from 30.48 to 137.16 cm (12 in to 54 in). The productivity of the arrangement is increased by a factor equal to the number of lamination frames per platen. In the two frame, two stack configuration of FIG. 2, the productivity of the lamination cycle increases by a factor of two over the prior art of FIG. 1. As a further example (not shown), platens large enough to accommodate four lamination frames and green sheet stacks increase the productivity of the lamination cycle by a factor of four over the prior art single lamination frame per platen.

Figure 3:
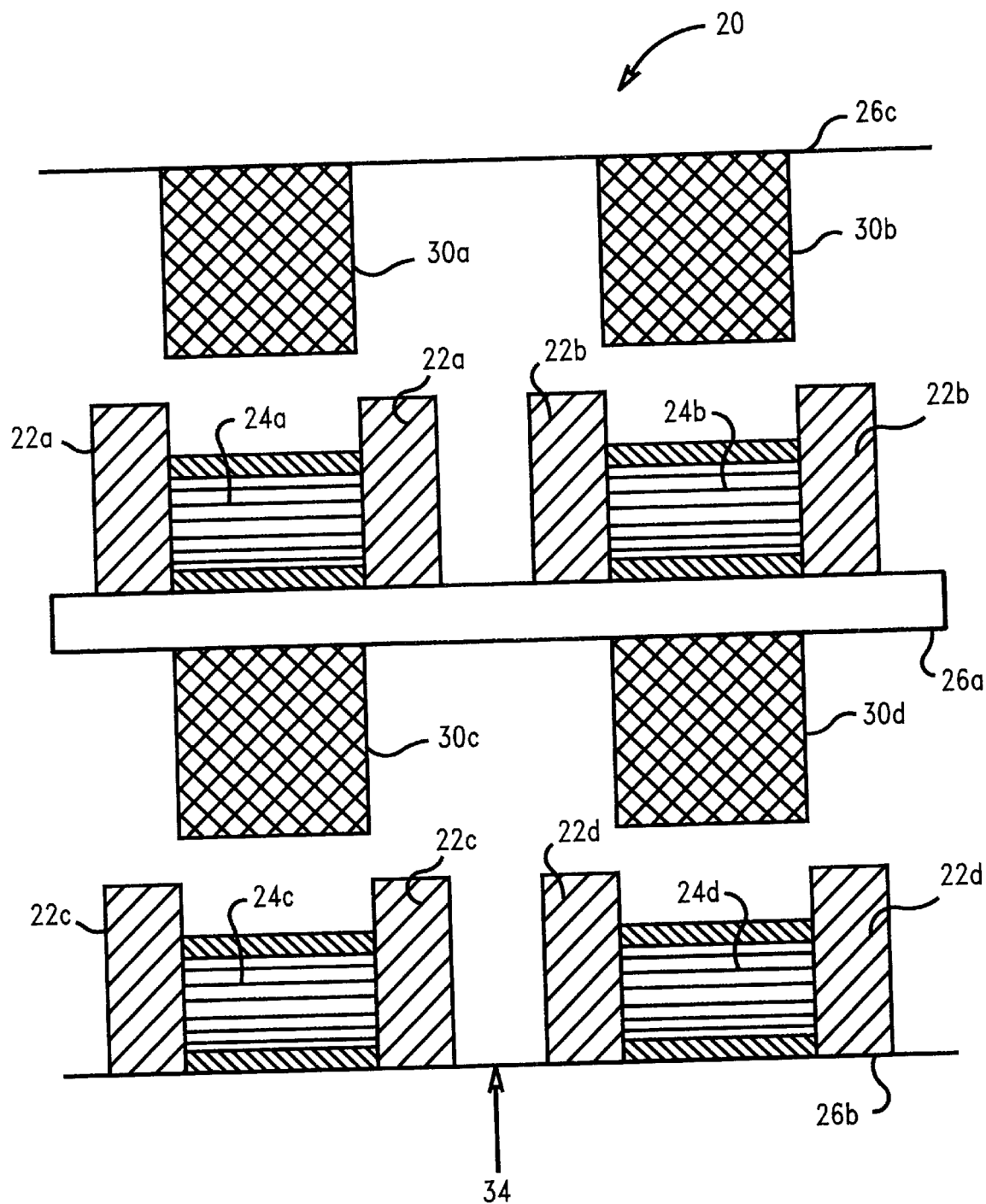
FIG. 3 illustrates a side elevational view of a multiple lamination frame center platen apparatus of the present invention for laminating a plurality of multilayer ceramics.

FIG. 3 illustrates an alternate embodiment of the lamination apparatus of the present invention. Multiple lamination frames are loaded per platen and multiple platens per lamination press (not shown) are used for a lamination process. For example lamination frames 22a,b are loaded on a first platen 26a. Similarly lamination frames 22c,d are loaded on the second platen 26b. The green sheet stacks 24a,b are laminated simultaneously between the platens 26a and 26c and simultaneously the green sheet stacks 24c,d are laminated simultaneously between the platens 26a and 26b. Lamination punches 30 align with each stack. Drive pressure is applied with the hydraulic press (not shown) to move the first platen 26a, the stacks 24c,d contact punches 30c,d respectively. Further, first platen begins to move until stacks 24a,b contact punches 30a,b respectively. Lamination pressure, typically ranging from 6,895 kPa to 48,265 kPa (1000 psi to 7000 psi) depending upon the product and the lamination cycle, is then applied to the stacks. Typically, the platens 26a,b are heated to a temperature above the glass transition temperature $T_g$ of the polymer in the green sheet formulation; however, a cold lamination process may also be used. The temperature and pressure are controlled for a predetermined time ensuring the bonding of the green sheets and the required laminate compressibility. In this arrangement the productivity of the lamination method is increased by a factor of 4 over the prior art of FIG. 1. As with the embodiment of FIG. 2 the productivity of the lamination cycle is limited only by the number of lamination frames 22 which can be accommodated by the platens 26a,b. As a further example, if additional lamination frames 24e,f (not shown) are loaded behind lamination frames 22a,b and additional lamination frames 22g,h (not shown) are loaded behind lamination frames 22c,d, the productivity of the lamination cycle is increased by a factor of 8 over the prior art of FIG. 1.

In the embodiment of FIG. 3 the stack 24 thickness in each lamination frame 22 on a platen 26 should be identical for proper green stack lamination. If there is a starting stack 20 thickness difference, the lamination pressure will not be uniform across all the stacks 22 on a given platen 26. This difficulty is resolved by a split lamination punch 31a,b as shown in the embodiment of FIG. 4.

Figure 4:
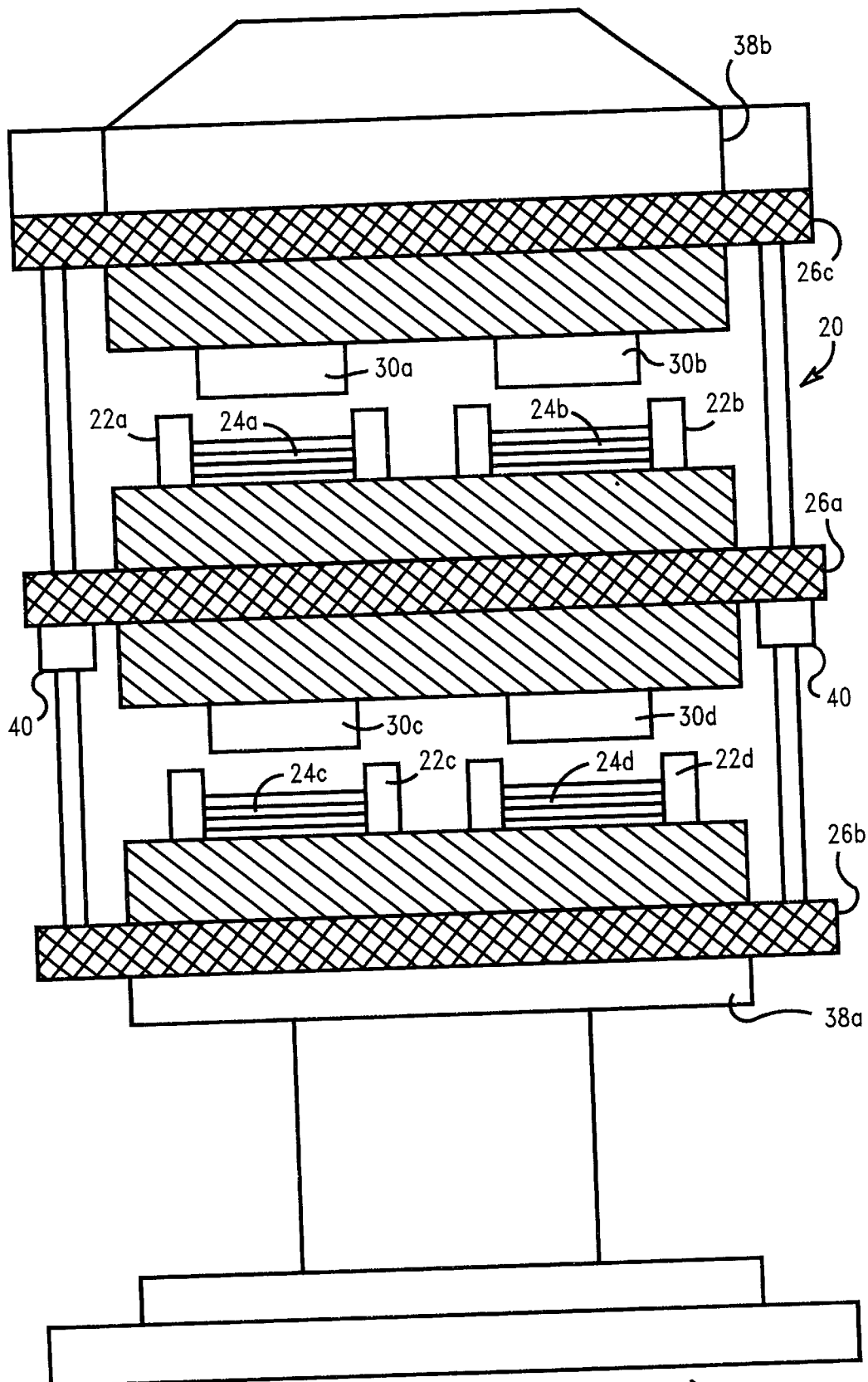
FIG. 4 illustrates the multiple platen embodiment of FIG. 3 installed on a hydraulic press.

The multiple platen embodiment of FIG. 3 is illustrated in FIG. 4 installed on a hydraulic press 36. The first platen 26a positioned between the rams 38a,b of the hydraulic press 36 and is suspended in position using stoppers 40.

Figure 5:
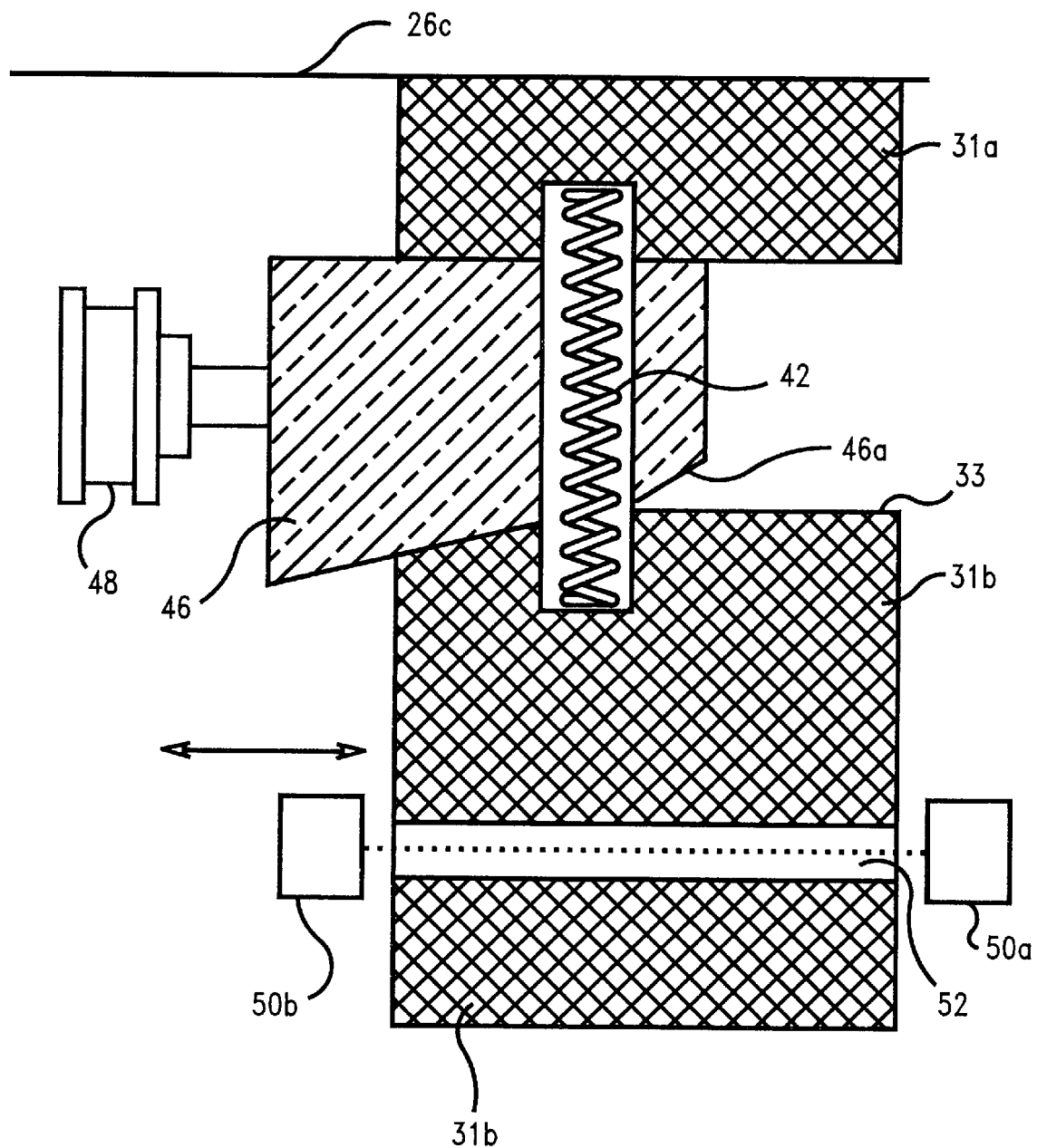
FIG. 5 illustrates a side elevational view of the present invention which uses lamination punch equalization to laminate a plurality of multilayer ceramics.

The alternate embodiment of FIG. 5 illustrates a split punch or height equalizing lamination punch 31a,b configuration of the present invention. The split configuration enables the lamination of a plurality of substrates with different thicknesses. The primary components of the lamination punch 31a,b are attached to the platen 26C. The working process of the split punch is explained below in the description of FIGS. 7A–7D. The second portion 31b of the lamination punch, is coupled to the first portion 31a, preferably by high tension spring 42. When the spring 42 is completely relaxed there is a space between the punch first portion 31a and the punch second portion 31b. A horizontally sliding wedge 46 is movably attached to the punch first portion 31a. The horizontal motion of the wedge 46 is controlled by a driver, preferably a plunger assembly 48. A sensor, preferably a light sensor 50 indicates the position of the punch second portion 31b by a light emitter 50a and light receiver 50b. The punch 31b has a through hole 52 allowing light to travel from emitter 50a to receiver 50b. The sensor components 50a,b are located such that the light passes through the hole 52, as indicated by the dotted line, when the spring 42 is completely relaxed. The bottom edge 46a of the wedge 46 is sloped at an angle that mates with the slope of the upper edge 33 of the punch second portion 31b. By positioning the wedge 46 with the plunger 48 into alignment with punch 31, movement of the punch 31b is prohibited. Similarly, by removing the wedge 46 from alignment with the punch 31a,b, movement of the punch 31b is possible.

Figure 6:
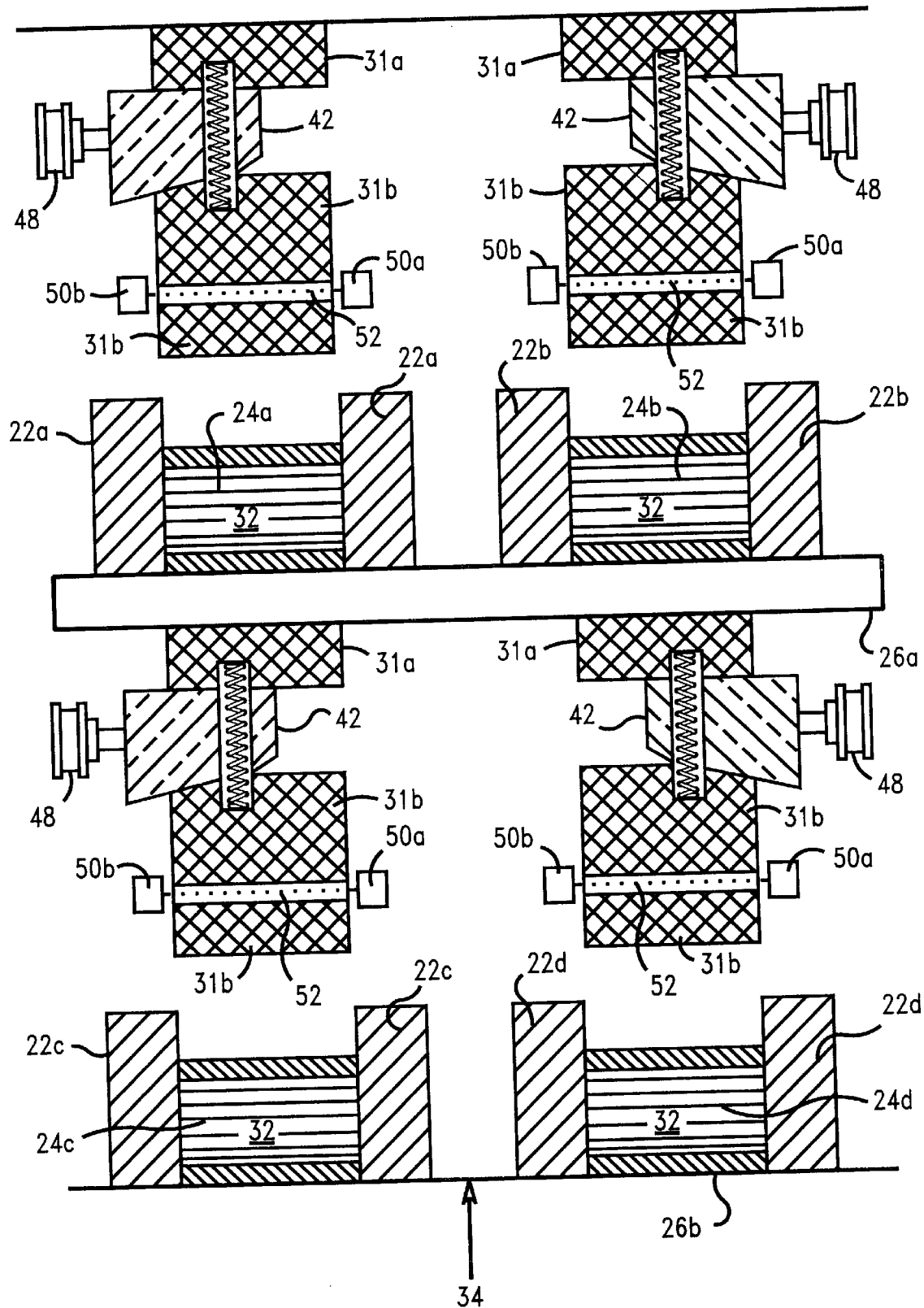
FIG. 6 illustrates a side elevational view of the present invention illustrating lamination punch equalization and a center platen to laminate a plurality of multilayer ceramics.

FIG. 6 illustrates a preferred embodiment of the present invention, combining a plurality of lamination frames of the embodiment of FIG. 3 with the split punch embodiment of FIG. 5. This embodiment produces high throughput at a low cost.

Figure 7A:
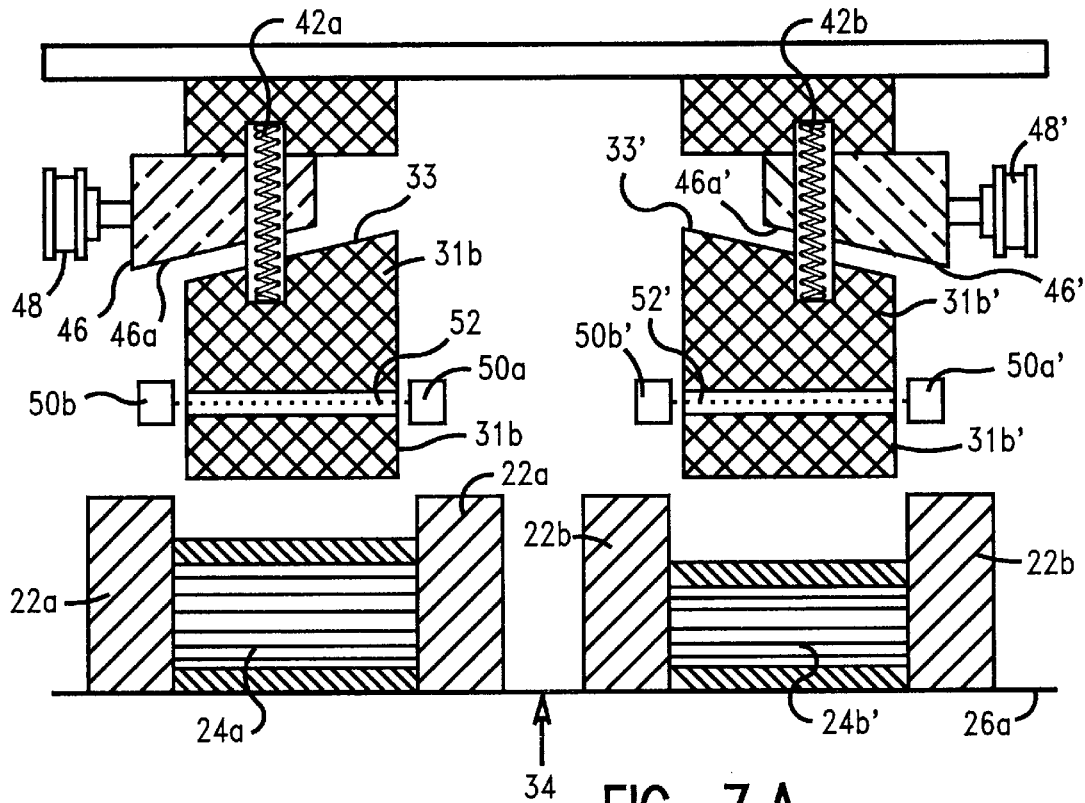
FIGS. 7A–7D illustrate a side elevational view of an embodiment of the present invention as it moves through the lamination cycle exerting uniform pressure to laminate a plurality of multilayer ceramics.

FIGS. 7A–7D illustrate the working of the split lamination punch 31 of FIG. 6. A thinner green sheet stack 24b' is laminated in the same lamination cycle as a thicker green sheet stack 24a. FIG. 7A illustrates the lamination frames 22a and 22b, with thicker green sheet stack 24a and thinner green sheet stack 24b' loaded on the platen 26a. The springs 42a,b are in a relaxed position; the punch second portions 31b,31b' are in the extended position; a gap is present between the punch second portion 31b and the wedge 46 as well as between the punch second portion 31b' wedge 46'; the wedges 46,46' are in their retracted positions; and the light receivers 50b,50b' receive light emitted from the light emitters 51a,51a' respectively which travels through the holes 52,52' in the punches 31b,31b' respectively. The platen 26a is actuated to move upwards with a drive pressure illustrated by arrow 34, to commence the lamination cycle.

Figure 7B:
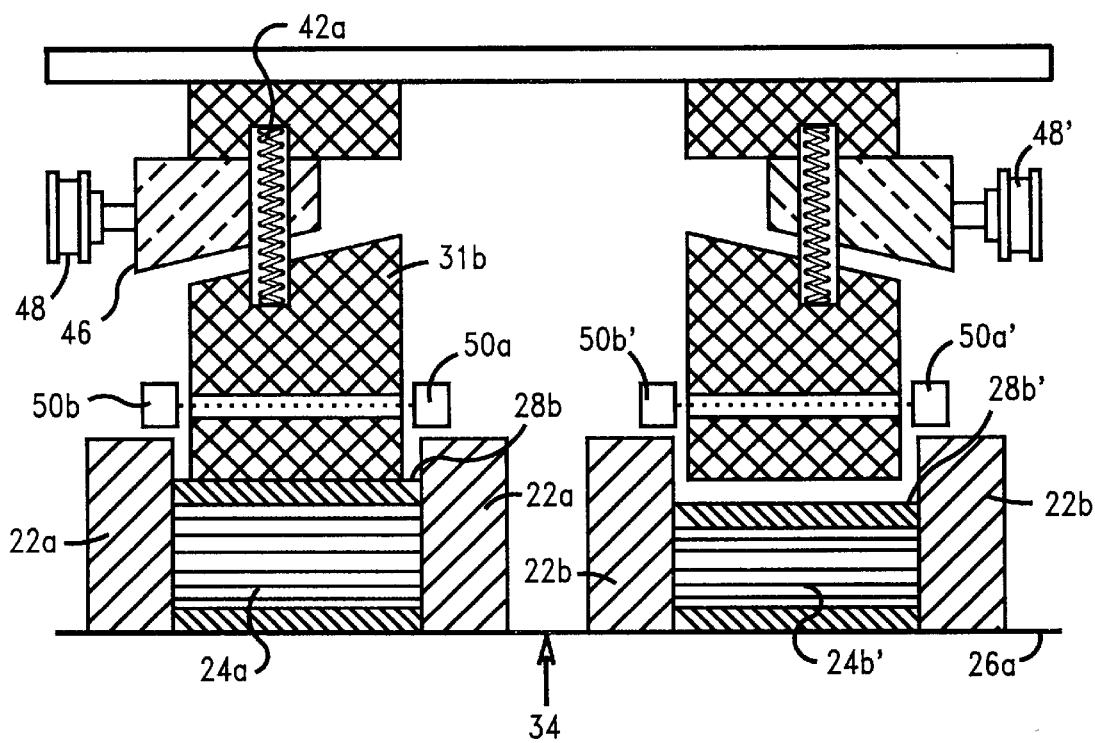
Figure 7:
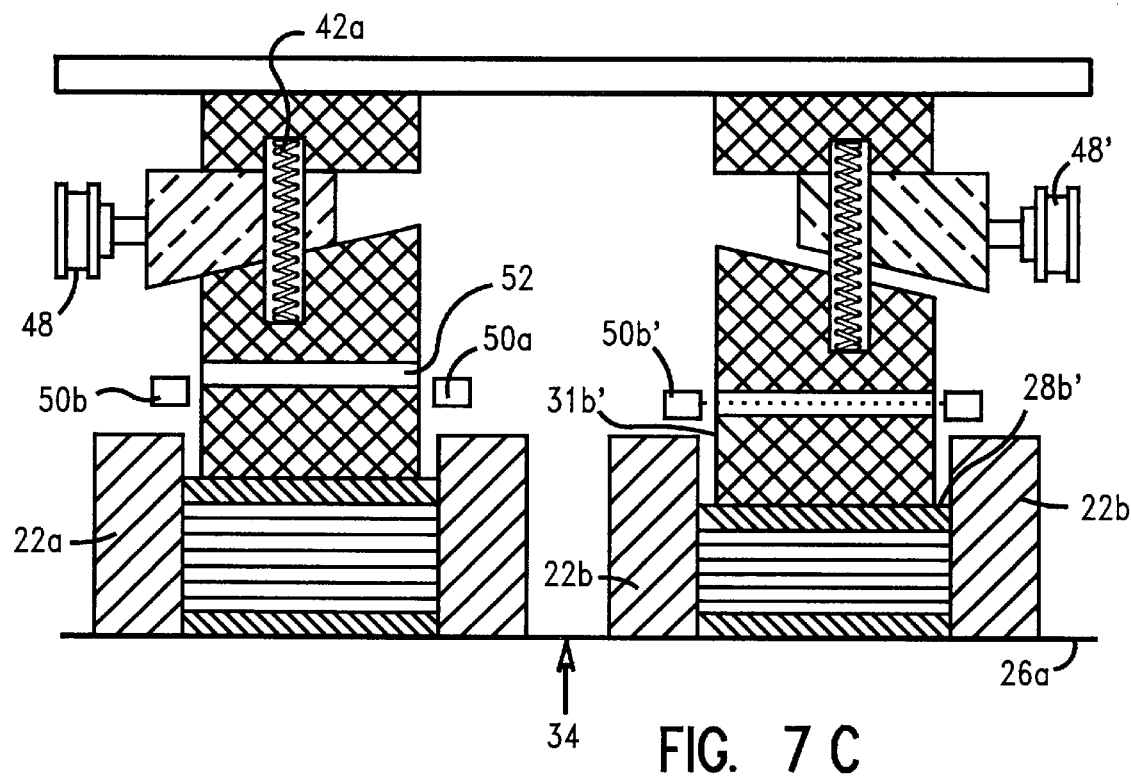
Figure 7:
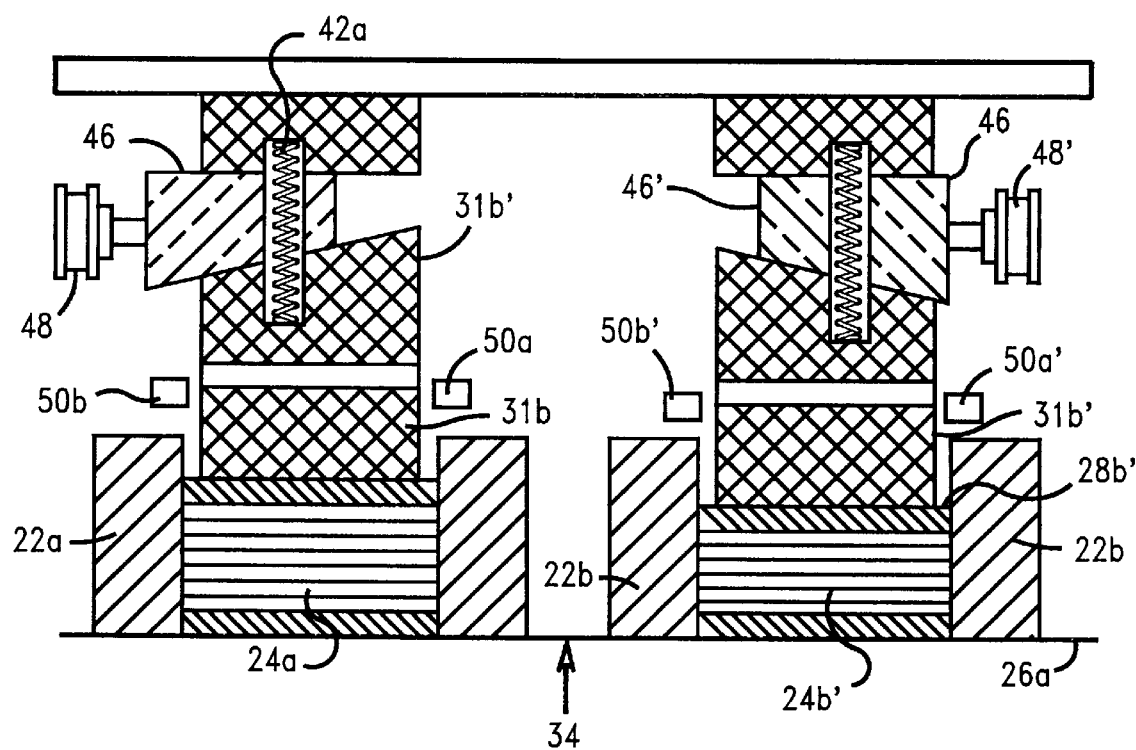

As illustrated in FIG. 7B, the thicker green sheet stack 24a comes in contact with the punch 31b first. The lamination plate 28b' has not yet contacted the punch 30b'. The platen 28a continues its move upward with drive pressure as indicated by arrow 34.

As illustrated in FIG. 7C, by the absence of a dotted line in through hole 52a, the light receiver 50b is not receiving the light signal from 50a. The light sensor 50 sends the information to a computer (not shown) which is monitoring the lamination cycle. The lamination plate 28b'contacts the punch 31b' and the platen 26a continues moving upward with drive pressure as indicated by arrow 34. The wedges 46,46' may or may not contact the punches 31b,31b' depending upon the height of the stacks.

In the final position of the upward stroke, illustrated by FIG. 7D, the punch 31b' contacts the wedge 46'. In this position, the light emitted from the light emitter 50a' is not received by the light receiver 50b' . The computer reads information from the sensor 50 which signals that the punch is 31b' has contacted the lamination plate 28b'. The computer stops the movement of the platen 26a and via the plungers 48,48', each of the wedges 46,46' slide into a position where the sloped edges 46a,46a' are fully aligned with the sloped edges 33,33' of the punches 31b,31b' respectively. The wedge rigidly secures the punch second portions to the punch first portions. Thus the movement of the punches 31b,31b' is arrested. The computer then controls the movement of the platen 26a to apply lamination pressure, which is much greater than drive pressure, uniformly on stacks 24a,24b'. The pressure is uniformly applied irrespective of their initial thickness of the stacks 24a,b'.

The following examples are intended to further illustrate the invention and are not intended to limit the scope of the invention in any manner.

EXAMPLE 1

Several samples of multilayer ceramic laminates containing various stack thicknesses were fabricated using process of this invention and the embodiment of FIG. 6. In one lamination process, pressure sensitive films were placed in every frame under the green sheet stacks of varying thicknesses. Upon proper calibration, these pressure sensitive films display varying color intensity when pressure variations exist. When the method and process used was according to the invention, the color intensity of the pressure sensitive films from all stacks was identical; thus the pressure was identical.

EXAMPLE 2

In another lamination process, using the embodiment of FIG. 6, one of the four split punches was made to work as a fixed punch by positioning the wedge in a fully aligned position with the punch second portion. The pressure sensitive films were used as explained in Example 1 above. The four green sheet stacks, one for each punch, were of different starting thicknesses. This lamination process yielded uniform pressure on all three split punch stacks. The fixed punch stack showed different pressure than the split punch stacks, thus demonstrating the need for the process of this invention.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A lamination method for laminating a plurality of stacks of substrate layers comprising the steps of:
   a) providing a platen adapted to receive said plurality of stacks of substrate layers thereon within a plurality of frames;
   b) providing a plurality of lamination punches, said punches each comprising a first portion and a second portion coupled to said first portion, said punches each aligned and adapted to apply pressure to said stacks, said first and second portions being movable relative to one another, in a direction towards and away from said stacks, and adapted for adjusting space to a desired distance between said first and second portions such that said punches adjust for different thickness in said plurality of stacks;
   c) providing a press for moving said platen and said punches in a direction towards one another for simultaneous lamination of said stacks;
   d) moving said press to effect contact of said stacks with said punches; and
   e) applying pressure to said stacks via said press.

2. A lamination method for laminating said stacks of substrate layers as claimed in claim 1 further comprising the step of heating said stacks for lamination.

3. A lamination method for laminating a plurality of stacks of substrate layers comprising:
   a) providing a first and second movable platen, said first movable platen having first and second sides and adapted to receive a first stack of said substrate layers on said first side, said second movable platen adapted to receive a second stack of said substrate layers on a side adjacent to said first platen;
   b) providing a first and second lamination punch, said first lamination punch comprising a first and second portion, positioned adjacent to said first platen aligned and adapted to apply pressure to said first stack, said second lamination punch comprising a first and second portion, secured to said second side of said first platen and adjacent to said second platen, said second punch aligned and adapted to apply pressure to said second stack;
   c) providing a press for moving said second platen and said first punch in a direction towards one another for lamination of said stacks;
   d) moving said press to effect contact of said second stack with said second lamination punch and to effect movement of said first stack to contact said first lamination punch; and
   e) applying pressure to said stack via said press.

4. A lamination method for laminating a stack of substrate layers as claimed in claim 3 further comprising the step of heating said stack for lamination.

5. A lamination method for laminating a stack of substrate layers comprising the steps of:
   a) providing a first and second movable platen, said first movable platen having first and second sides and adapted to receive a first stack of said substrate layers on said first side, said second movable platen adapted to receive a second stack of said substrate layers on a side adjacent to said first platen;
   b) providing a first and second lamination punch, said first lamination punch positioned adjacent to said first platen aligned and adapted to apply pressure to said first stack, said second lamination punch secured to said second side of said first platen and adjacent to said second platen, said second punch aligned and adapted to apply pressure to said second stack, said punches comprising:
   a first portion and a second portion coupled to said first portion, said punch aligned and adapted to apply pressure to said stack, said first and second portions being movable relative to one another, in a direction towards and away from said stack, and adapted for adjusting space to a desired distance between said first and second portions;
   c) providing a press for moving said platen and said punch in a direction towards one another for lamination of said stacks;
   d) moving said press to effect contact of said second stack with said second lamination punch and to effect movement of said first stack to contact said first lamination punch; and
   e) applying pressure to said stack via said press.

6. A lamination method for laminating a stack of substrate layers as claimed in claim 5 further comprising the step of heating said stack for lamination.

7. A lamination method for laminating a plurality of stacks of substrate layers comprising the steps of:
   a) providing a platen adapted to receive a plurality of stacks of said substrate layers thereon within a plurality of frames;
   b) providing a plurality of lamination punches, said punches each comprising a first portion and a second portion coupled to said first portion, said punches each aligned and adapted to apply pressure to each of said stacks, said first and second portions being movable relative to one another, in a direction towards and away from said stacks, and adapted for adjusting space to a desired distance between said first and second portions;

c) providing a press for moving said platen and said punches in a direction towards one another for lamination of said stacks;

d) moving said punches second portions toward said platen to effect contact with said stacks;

e) securing each of said punch first portion to said punch second portion rigidly; and f) applying pressure to said stacks via said press.

8. A lamination method for laminating a plurality of stacks of substrate layers as claimed in claim 7 further comprising the step of heating said stacks for lamination.

9. A lamination method for laminating stacks of substrate layers comprising the steps of:

a) providing a platen adapted to receive first and second stacks of said substrate layers thereon;

b) providing a first and second lamination punch, said first punch comprising a first portion and a second portion coupled to said first portion, said first punch aligned and adapted to apply pressure to said first stack, said second punch comprising a first portion and a second portion coupled to said first portion, said second punch aligned and adapted to apply pressure to said second stack, said first punch first and second portions being movable relative to one another, in a direction towards and away from said stacks, and adapted for adjusting space to a desired distance between said first and second portions, said second punch first and second portions being movable relative to one another, in a direction towards and away from said stacks, and adapted for adjusting space to a desired distance between said first and second portions;

c) providing a press for moving said platen and said first and second punches in a direction towards one another for lamination of said stack;

d) moving said first punch second portion toward said platen to effect contact with said first stack;

e) moving said second punch second portion toward said platen to effect contact with said second stack;

f) securing said first punch first portion to said first punch second portion rigidly;

g) securing said second punch first portion to said second punch second portion rigidly; and h) applying pressure to said stacks simultaneously via said press.

10. A lamination method for laminating stacks of substrate layers as claimed in claim 9 further comprising the step of heating said stacks for lamination.

11. A lamination apparatus for laminating a plurality of stacks of substrate layers comprising:

a platen adapted to receive said plurality of stacks of substrate layers thereon, within a plurality of frames;

a plurality of lamination punches, said punches each comprising a first portion and a second portion coupled to said first portion, said punches each aligned and adapted to apply pressure to said stack, said first and second portions being movable relative to one another, in a direction towards and away from said stacks, and adapted for adjusting space to a desired distance between said first and second portions to adjust for different thickness in said plurality of stacks; and a press for moving said platen and said punches in a direction towards one another for simultaneous lamination of said stacks.

12. A lamination apparatus as claimed in claim 11 further comprising a plurality of wedges, each wedge slidably mounted to said punch first portion, said wedge adapted to adjust for different thickness in said plurality of stacks of substrate layers; movement of said wedge effected by a driver mounted to said wedge.

13. A lamination apparatus as claimed in claim 12 wherein said driver 2 comprises a plunger.

14. A lamination apparatus as claimed in claim 11 further comprising a plurality of sensors for sensing the position of each of said punches.

15. A lamination apparatus as claimed in claim 14 wherein said sensor comprises:

a light receiver; and a light emitter, emitting a light beam, said light beam traveling through a hole in said punch second portion for sensing by said light receiver for adjusting said wedge for different thickness in said plurality of stacks of substrate layers.

16. A lamination apparatus for laminating a plurality of stacks of substrate layers comprising:

a first and second movable platen, said first movable platen having first and second sides and adapted to receive a first stack of said substrate layers on said first side, said second movable platen adapted to receive a second stack of said substrate layers on a side adjacent to said first platen;

a first and second lamination punch, said first lamination punch comprising a first and second portion, positioned adjacent to said first platen aligned and adapted to apply pressure to said first stack, said second lamination punch comprising a first and second portion, secured to said second side of said first platen and adjacent to a press for moving said second platen and said first punch in a direction towards one another for lamination of said stacks such that said press is adapted for moving said second stack to contact said second punch second portion and subsequently moving said first stack to contact said first punch second portion.

17. A lamination apparatus as claimed in claim 16 further comprising a plurality of sensors for sensing the position of each of said punches.

18. A lamination apparatus as claimed in claim 17 wherein said sensor comprises:

a light receiver; and a light emitter, emitting a light beam, said light beams traveling through a hole in said punch second portion for sensing by said light receiver for adjusting said wedge for different thickness in said plurality of stacks of substrate layers.

19. A lamination apparatus as claimed in claim 16 wherein said punch comprises a first portion and a second portion coupled to said first portion, said punch aligned and adapted to apply pressure to said stack, said first and second portions being movable relative to one another, in a direction towards and away from said stack, and adapted for adjusting space to a desired distance between said first and second portions.

20. A lamination apparatus as claimed in claim 19 further comprising a wedge slidably mounted to said punch first portion, movement of said wedge effected by a driver mounted to said wedge.

21. A lamination apparatus as claimed in claim 20 wherein said driver comprises a plunger.

22. A lamination apparatus as claimed in claim 19 further comprising a sensor for sensing the position of said punch.

23. A lamination apparatus as claimed in claim 22 wherein said sensor comprises:

a light receiver; and a light emitter, emitting a light beam, said light beams traveling through a hole in said punch second portion for sensing by said light receiver.

* * * * *